(12) United States Patent
Shiu et al.

(10) Patent No.: US 12,272,573 B2
(45) Date of Patent: Apr. 8, 2025

(54) LOAD PORT AND METHODS OF OPERATION

(71) Applicant: Taiwan Semiconductor Manufacturing Company, Ltd., Hsinchu (TW)

(72) Inventors: Yi-Fam Shiu, Toufen (TW); Ting-Yau Shiu, Taoyuan (TW); Cheng-Lung Wu, Zhunan Township (TW); Yang-Ann Chu, Hsinchu (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 720 days.

(21) Appl. No.: 17/304,910

(22) Filed: Jun. 28, 2021

(65) Prior Publication Data

US 2022/0293440 A1 Sep. 15, 2022

Related U.S. Application Data

(60) Provisional application No. 63/200,512, filed on Mar. 11, 2021.

(51) Int. Cl.
*H01L 21/67* (2006.01)
*H01L 21/677* (2006.01)

(52) U.S. Cl.
CPC .. *H01L 21/67201* (2013.01); *H01L 21/67011* (2013.01); *H01L 21/67242* (2013.01); *H01L 21/67739* (2013.01); *H01L 21/67748* (2013.01)

(58) Field of Classification Search
CPC ......... H01L 21/67201; H01L 21/67011; H01L 21/67242; H01L 21/67739;
(Continued)

(56) References Cited

U.S. PATENT DOCUMENTS 8,026,113 B2 * 9/2011 Kaushal ............ H01L 21/67253
702/182
8,464,594 B2 * 6/2013 Narendrnath ........... G01F 1/663
73/861

(Continued)

FOREIGN PATENT DOCUMENTS

CN 102714169 A * 10/2012 ....... H01L 21/67359
CN 107275257 A * 10/2017 ............ F04C 29/065
(Continued)

*Primary Examiner* — Mohammed Shamsuzzaman
(74) *Attorney, Agent, or Firm* — Harrity & Harrity, LLP

(57) ABSTRACT

A load port is capable of monitoring various environmental parameters associated with a transport carrier to minimize and/or prevent exposure of the semiconductor substrates therein to increased humidity, increased oxygen, increased vibration, and/or one or more other elevated environmental conditions that might otherwise contaminate the semiconductor substrates, damage the semiconductor substrates, and/or cause processing defects. For example, the load port may monitor the environmental parameters as indicators of a potential blockage of a diffuser of the transport carrier, and a relief valve may be used to divert a gas away from the transport carrier based on a determination that a diffuser blockage has occurred. In this way, the gas may be diverted through the relief valve and away from the transport carrier to prevent increased humidity, contaminants, and/or vibration from contaminating and/or damaging the semiconductor substrates.

20 Claims, 10 Drawing Sheets

(58) Field of Classification Search
CPC ......... H01L 21/67748; H01L 21/67389; H01L 21/67775; H01L 21/67253; G05D 27/02
See application file for complete search history.

(56) References Cited

U.S. PATENT DOCUMENTS

| | | | |
|---|---|---|---|
| 10,395,959 | B2 | 8/2019 | Babbs et al. |
| 2002/0124906 | A1 | 9/2002 | Suzuki et al. |
| 2005/0140961 | A1* | 6/2005 | Yanagisawa ............ G03F 7/709 355/75 |
| 2012/0086107 | A1* | 4/2012 | Yamamoto .......... H01L 21/0228 257/632 |
| 2018/0126650 | A1* | 5/2018 | Murphree ................. B08B 5/04 |
| 2018/0358249 | A1 | 12/2018 | Nagaike |
| 2020/0058531 | A1 | 2/2020 | Matsumoto et al. |
| 2020/0227295 | A1* | 7/2020 | Murata .................... B65G 1/00 |
| 2021/0235583 | A1* | 7/2021 | Yang ................. H01L 21/67389 |

FOREIGN PATENT DOCUMENTS

| | | | | |
|---|---|---|---|---|
| TW | 201533829 A | * | 9/2015 | ....... H01L 21/67389 |
| TW | 201907504 A | | 2/2019 | |
| TW | 202042336 A | | 11/2020 | |

\* cited by examiner

LOAD PORT AND METHODS OF OPERATION

CROSS-REFERENCE TO RELATED APPLICATION

This patent application claims priority to U.S. Provisional Patent Application No. 63/200,512, filed on Mar. 11, 2021, and entitled "LOAD PORT AND METHODS OF OPERATION." The disclosure of the prior application is considered part of and is incorporated by reference into this patent application.

BACKGROUND

A semiconductor substrate such as a wafer may be processed in various semiconductor processing tools in a semiconductor fabrication facility to produce various integrated circuits and/or semiconductor devices. A semiconductor substrate may be transported throughout the semiconductor fabrication facility and/or between the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
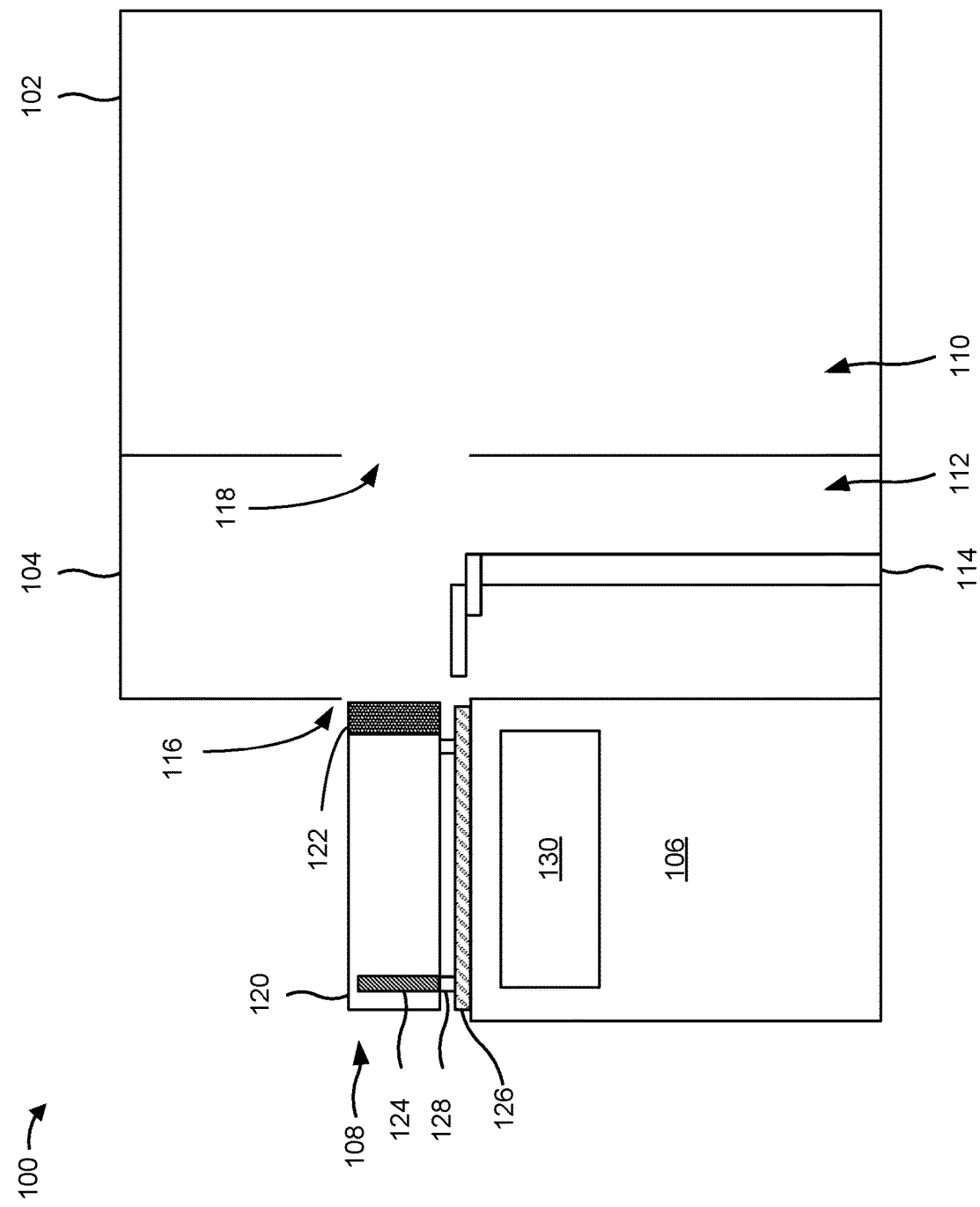
FIG. 1 is a diagram of an example semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A plurality of semiconductor substrates may be transported throughout a semiconductor fabrication facility in a transport carrier. A transport carrier may include a wafer cassette, a front-opening unified pod (FOUP), a pod, a container, or a similar type of device. To transfer a semiconductor substrate from a transport carrier to a semiconductor processing tool, the transport carrier may be placed in and/or on a load port associated with the semiconductor processing tool. A transport tool included in an interface tool (e.g., an equipment front end module (EFEM) or similar type of interface tool) that is situated between the semiconductor processing tool and the load port may remove the semiconductor substrate from the transport carrier. The transport tool may transfer the semiconductor substrate from the transport carrier to the semiconductor processing tool through a chamber of the interface tool. The transport tool may perform the above-described process in reverse to transfer the semiconductor substrate from the semiconductor processing tool to the transport carrier after processing.

While situated on the load port, a gas may be provided into the transport carrier through a diffuser in the transport carrier. The gas may be cycled through the transport carrier to purge or remove contaminants in the transport carrier and to maintain the humidity in the transport carrier at or near a humidity setting. In some cases, the diffuser in the transport carrier may become blocked (e.g., by debris or other foreign objects), which can cause the humidity level in the transport carrier to rise, can reduce the effectiveness of contaminant removal from the transport carrier, and/or can cause the transport carrier to vibrate. The increased humidity level may result in moisture attracting the contaminants in the transport carrier onto the semiconductor substrates stored therein, which can damage the semiconductor substrates and/or cause processing defects in subsequent semiconductor processing operations. Moreover, vibration of the transport carrier can cause movement and damage to the semiconductor substrates stored therein.

Some implementations described herein provide a load port that is capable of monitoring various environmental parameters associated with a transport carrier to minimize and/or prevent exposure of the semiconductor substrates therein to increased humidity, increased oxygen, increased vibration, and/or one or more other elevated environmental conditions that might otherwise contaminate the semiconductor substrates, damage the semiconductor substrates, and/or cause processing defects. For example, the load port may monitor the environmental parameters as indicators of a potential blockage of a diffuser of the transport carrier, and a relief valve may be used to divert a gas away from the transport carrier based on a determination that a diffuser blockage has occurred. In this way, the gas may be diverted through the relief valve and away from the transport carrier to prevent increased humidity, contaminants, and/or vibration from contaminating and/or damaging the semiconductor substrates. This may increase semiconductor manufacturing yield, may support longer queue times, and/or may increase semiconductor manufacturing quality. The load port may also include one or more isolation valves that are capable of isolating various components of the load port in the flow path of the gas to monitor the components for leaks. In this way, leaking components may be repaired, replaced, and/or compensated for to maintain the effectiveness of the environmental control in the transport carrier.

FIG. 1 is a diagram of an example semiconductor processing environment 100 described herein. The example semiconductor processing environment 100 may include, or may be included in, a semiconductor fabrication facility, a semiconductor foundry, a semiconductor processing facility, a semiconductor clean room, and/or another environment in which semiconductor wafers and/or devices are processed. As shown in FIG. 1, the example semiconductor processing environment 100 may include a semiconductor processing tool 102, an interface tool 104, and a load port 106 on which a transport carrier 108 may be supported, among other tools and/or devices.

The semiconductor processing tool 102 may include one or more tools configured to perform one or more semiconductor processing operations on one or more semiconductor substrates and/or devices. For example, the semiconductor processing tool 102 may include a deposition tool (e.g., a semiconductor processing tool configured to deposit one or more layers onto a semiconductor substrate), a plating tool (e.g., an electroplating tool configured to deposit one or more metal layers onto a semiconductor substrate), an exposure tool (e.g., an extreme ultraviolet (EUV) tool, an electron beam (e-beam) tool), an etch tool (e.g., a wet etch tool, a dry etch tool), or another type of semiconductor processing tool. The semiconductor processing tool 102 may include a chamber 110 in which semiconductor substrates may be processed.

The interface tool 104 may include an equipment front end module (EFEM) or another tool that includes a chamber 112 and is configured to transfer semiconductor substrates between the semiconductor processing tool 102 and the transport carrier 108 on the load port 106. The interface tool 104 may further include a transport tool 114 in the chamber 112. The transport tool 114 may include a robotic arm or another type of tool that is configured to transport semiconductor substrates between the transport carrier 108 and the semiconductor processing tool 102. In some implementations, the transport tool 114 transfers semiconductor substrates between the transport carrier 108 and a staging area of the semiconductor processing tool 102. In some implementations, the transport tool 114 transfers semiconductor substrates between the transport carrier 108 and the semiconductor processing tool 102 through openings 116 and 118 in the chamber 112.

The transport carrier 108 may include a wafer cassette, a FOUP, a pod, a container, or a similar type of device configured to hold and/or store a plurality of semiconductor substrates. The transport carrier 108 may include a housing 120 and a door 122 configured to be removably attached to the housing 120. The door 122 may form a hermetic seal around an opening in the housing 120 such that the environment in the transport carrier 108 may be controlled when the door 122 is attached to the housing 120. The door 122 may be removed from the housing 120 to permit the transport tool 114 to access the internal space of the housing 120 through the opening 116.

The transport carrier 108 may further include one or more diffusers 124 in the housing 120. The diffuser(s) 124 may be configured to distribute a gas into the transport carrier 108 to purge the transport carrier 108 of contaminants, to maintain the humidity (e.g., relative humidity level) in the transport carrier 108 at or below a humidity setting or a humidity threshold, and/or to control one or more other environmental aspects in the transport carrier 108. The diffuser(s) 124 may include an elongated member that is perforated and attached to a bottom (or another location) of the housing 120.

The load port 106 may include a load port stage 126 and a plurality of ports (or pattern nozzles) 128 on the load port stage 126. The load port stage 126 and the plurality of ports 128 may be configured to receive and support the transport carrier 108 on the load port 106. The load port 106 and the load port stage 126 may receive the transport carrier 108 from a transport robot, a transport cart, an overhead hoist transport (OHT), or another device configured to move transport carriers to and from various locations in the example semiconductor processing environment 100. The load port 106 may also include a gas supply system 130. The gas supply system 130 may be configured to provide the gas to the diffuser(s) 124 of the transport carrier 108 through a first subset of the ports 128, and may be configured to purge or extract the gas from the transport carrier 108 through a second subset of the ports 128.

As indicated above, FIG. 1 is provided as an example. Other examples may differ from what is described with regard to FIG. 1.

Figure 2:
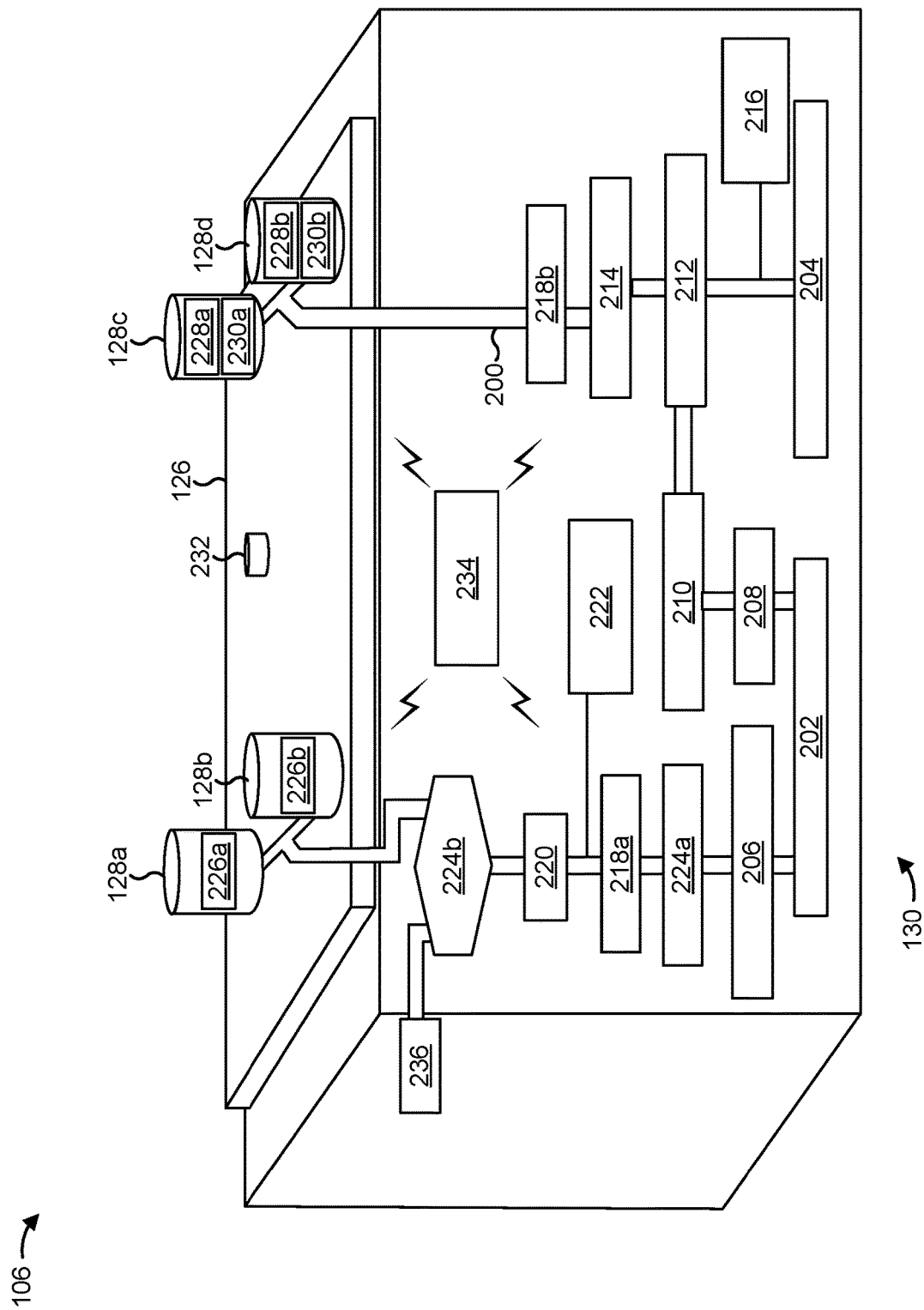
FIG. 2 is a diagram of an example load port described herein for use in the semiconductor processing environment of FIG. 1.

FIG. 2 is a diagram of the example load port 106 described herein for use in the semiconductor processing environment 100 of FIG. 1. FIG. 2 illustrates a detailed view of the gas supply system 130 of the load port 106. As shown in FIG. 2, the gas supply system 130 may include a plurality of components, including pneumatic components, electrical/electronic components, other types of components, and/or a combination thereof. The pneumatic components may be interconnected by a pipeline 200. The pipeline 200 may include pipes, tubes, couplers, connectors, and/or other types of plumbing fixtures configured to carry a gas.

The gas supply system 130 may be coupled to a gas storage tank or facility air system by a gas inlet 202, and may be coupled to an exhaust system or the facility air system by a gas outlet 204. The gas may be provided to the gas supply system 130 through the gas inlet 202 and may be exhausted or removed from the gas supply system 130 through the gas outlet 204. The gas may include an extra clean dry air (ECDA), an inert gas such as nitrogen (N2), argon (Ar), and/or another inert gas, and/or another type of gas.

The gas inlet 202 may be coupled to a regulator 206 and a regulator 208 by the pipeline 200. The regulator 206 may be configured to control a supply flow of the gas from the gas inlet 202 to inlet ports 128a and 128b of the load port 106. The regulator 206 may include a numeric regulator or another type of digitally-controlled regulator that is capable of real-time (or near-real-time) and fine-tuned adjustment of the supply flow of the gas from the gas inlet 202 to inlet ports 128a and 128b. The regulator 206 may use a feedback loop to adjust the supply flow of the gas. For example, the regulator 206 may be configured to control a flow rate of the supply flow based on a pressure setting (e.g., such that the flow rate achieves a pressure of the supply flow within a range or a tolerance of the pressure setting) and pressure data from one or more pressure sensors included in the gas supply system 130. As another example, the regulator 206 may be configured to control a pressure of the supply flow based on a flow rate setting (e.g., such that the pressure achieves a flow rate of the supply flow within a range or a tolerance of the flow rate setting) and flow rate data from one or more flow rate sensors included in the gas supply system 130.

The regulator 208 may include a solenoid valve or another type of regulator that is configured to control a control flow of the gas through a valve 210 to a vacuum generator 212 at a constant pressure. The control flow of the gas may be used to control a return flow of the gas from outlet ports 128c and 128d and may be used to control an exhaust flow through the gas outlet 204. For example, the regulator 208 may be set such that control flow of the gas to the vacuum generator 212 permits the vacuum generator 212 (e.g., a pump or another type of device that is capable of generating a partial vacuum or negative pressure in the pipeline 200) to generate the return flow of the gas at or near a particular flow rate or pressure. The regulators 206 and 208 may be separate and independently controlled regulators such that the regulators 206 and 208 may independently control the supply flow of the gas and the control flow of the gas, respectively. In this way, the regulator 206 is permitted to optimize the supply flow of the gas, and the regulator 208 is permitted to optimize the control flow of the gas, which may increase the performance and efficiency of the gas supply system 130.

The valve 210 may include a solenoid valve or another type of valve that is configured to selectively open and close to block the control flow of the gas and to permit the control flow of the gas to flow to the vacuum generator 212. A valve 214 (e.g., a solenoid valve or another type of valve) may be configured to selectively open and close to block the return flow of the gas and to permit the return flow of the gas to flow to the vacuum generator 212. A pressure sensor 216 may be included in the pipeline 200 to monitor the exhaust flow from the vacuum generator 212 to the gas outlet 204 and to generate pressure data based on the exhaust flow. The exhaust flow may include a combination of the return flow of the gas and the control flow of the gas.

The gas supply system 130 may include one or more flow rate sensors 218. A flow rate sensor 218*a* may be included in the pipeline 200 upstream from the regulator 206 and before the inlet ports 128*a* and 128*b*. The flow rate sensor 218*a* may include a flow meter or another type of sensor that is configured to generate flow rate data based on the supply flow of the gas. The flow rate data may be used to control the regulator 206. In some implementations, the gas supply system 130 includes a second flow rate sensor 218*b*. The flow rate sensor 218*b* may include a flow meter or another type of sensor that is configured to generate flow rate data based on the return flow of the gas. The flow rate data associated with the supply flow of the gas and the flow rate data associated with the return flow of the gas may be used to detect, determine, and/or identify blockages of the diffuser(s) 124 of the transport carrier 108, as described herein.

The gas supply system 130 may include one or more filters 220. The filter(s) 220 may include pleated filters, electronic filters, high-efficiency particulate absorbing (HEPA) filters, and/or other types of air filters that are configured to filter or remove particles of the gas at various locations along the pipeline 200.

A pressure sensor 222 may be included in the pipeline 200 between a plurality of isolation valves 224, which may be included between the regulator 206 and the inlet ports 128*a* and 128*b*. The isolation valves 224 may include solenoid valves or other types of valves that are configured to selectively open and close to block the supply flow of the gas and to permit the supply flow of the gas to flow. When the isolation valves 224 are closed, the isolation valves 224 isolate one or more components in the gas supply system 130 such that the pressure sensor 222 may generate pressure data for the purpose of determining whether a leakage has occurred in the one or more components, as described herein.

The gas supply system 130 may include pressure sensors 226*a* and 226*b* that are configured generate pressure data (e.g., a signal, a communication, a voltage, a current) associated with a pressure of the supply flow of the gas at or near the inlet ports 128*a* and 128*b*, respectively. The pressure sensors 226*a* and 226*b* may be located on or proximate to the inlet ports 128*a* and 128*b*, respectively, such that the pressure data may be representative of a pressure in the gas supply system 130 at or near the point of entry into the diffuser(s) 124 of the transport carrier 108.

The gas supply system 130 may include pressure sensors 228*a* and 228*b* that are configured generate pressure data (e.g., a signal, a communication, a voltage, a current) associated with a pressure of the return flow of the gas at or near the outlet ports 128*c* and 128*d*, respectively. The pressure sensors 228*a* and 228*b* may be located on or proximate to the outlet ports 128*c* and 128*b*, respectively, such that the pressure data is representative of a pressure of the gas supply system 130 at or near the point of exit from the transport carrier 108.

The gas supply system 130 may include humidity sensors (or hygrometers) 230*a* and 230*b* that are configured to generate humidity data (e.g., a signal, a communication, a voltage, a current) associated with a relative humidity level of the supply flow of the gas out of the transport carrier 108 at or near the outlet ports 128*c* and 128*d*, respectively. The humidity sensors 230*a* and 230*b* may be located on or proximate to the outlet ports 128*c* and 128*b*, respectively, such that the humidity data is representative of a relative humidity level in transport carrier 108.

The sensors 226*a*, 226*b*, 228*a*, 228*b*, 230*a*, and 230*b* may be located on the plurality of ports 128 or in close proximity to the plurality of ports 128 (e.g., less than or equal to approximately 10 millimeters away from the plurality of ports 128). In this way, the sensors 226*a*, 226*b*, 228*a*, 228*b*, 230*a*, and 230*b* may be positioned to generate accurate sensor data and so that the sensor data accuracy is not affected (or minimally affected) by environmental turbulence and signal noise in the pipeline 200.

The gas supply system 130 may include a vibration sensor 232 on the load port stage 126. The vibration sensor 232 may be configured to generate vibration data associated with load port stage 126. The vibration data may represent a vibration level or magnitude of the vibration of the load port stage 126. Vibration of the load port stage 126 may be caused by vibration of the transport carrier 108 when the transport carrier 108 is positioned on the load port 106. Vibration of the transport carrier 108 may be caused by a blocked diffuser 124. Accordingly, the vibration data generated by the vibration sensor 232 may be used to determine whether a blockage of a diffuser 124 has occurred.

The sensor data generated by the sensors of the gas supply system 130 may be provided to a controller 234 included in the gas supply system 130. The controller 234 may include a processor, a microcontroller, a programmable logic control (PLC), or another type of computing device. The controller 234 may receive the sensor data, may determine whether a blockage of a diffuser 124 of transport carrier 108 has occurred based on the sensor data, and may control one or more actuators included in the gas supply system 130 based on whether a blockage has occurred, as described herein. The controller 234 may also determine whether a leakage in one or more components of the gas supply system 130 has occurred based on the sensor data, and may control one or more actuators included in the gas supply system 130 based on whether a leakage has occurred, as described herein.

The gas supply system 130 may include a relief valve 236. The relief valve 236 may be coupled to the isolation valve 224*b* by the pipeline 200 or may be included in the flow path of the supply flow of the gas. The relief valve 236 may be used to relieve or reduce the pressure of the supply flow of the gas into the transport carrier 108, such as in cases where a blockage of a diffuser 124 has occurred. In this way, a pressure build-up may be mitigated by opening the relief valve 236 to prevent the pressure build-up from causing vibration of the transport carrier 108, causing increased humidity in the transport carrier 108, and/or reducing the effectiveness of the gas supply system 130 to remove contaminants from the transport carrier 108.

As indicated above, FIG. 2 is provided as an example. Other examples may differ from what is described with regard to FIG. 2.

Figure 3:
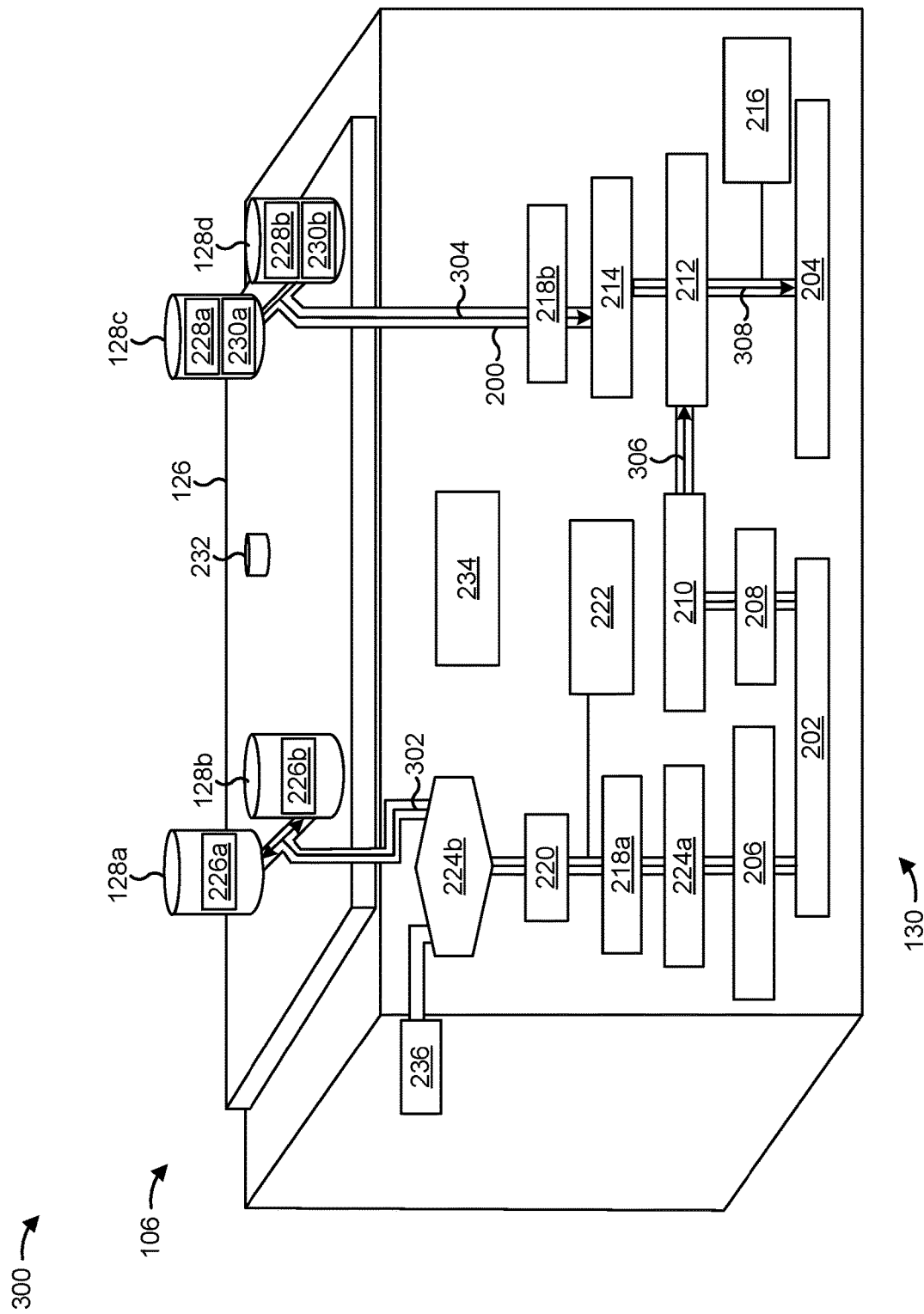
FIGS. 3, 4A, 4B, 5A, and 5B are diagrams of example implementations described herein.

FIG. 3 is a diagram of an example implementation 300 described herein. The example implementation 300 may include an example of the flow paths of a gas through the gas supply system 130 of the load port 106.

As shown in FIG. 3, a supply flow 302 of the gas may enter the gas supply system 130 through the gas inlet 202. The supply flow 302 may continue into the pipeline 200 through the regulator 206, which may control the pressure or flow rate of the supply flow 302. The supply flow 302 may continue through the isolation valve 224a, the flow rate sensor 218a (which may generate flow rate data based on the flow rate of the supply flow 302), the filter 220 (which may filter the supply flow 302), the isolation valve 224b, and to the inlet ports 128a and 128b. The supply flow 302 may flow through the inlet ports 128a and 128b into the diffuser(s) 124 of the transport carrier 108, and may be dispersed into the transport carrier 108 by the diffuser(s) 124.

As further shown in FIG. 3, a return flow 304 of the gas may be returned to the gas supply system 130 from the transport carrier 108 through the outlet ports 128c and 128d. The return flow 304 may continue through the flow rate sensor 218b (which may generate flow rate data based on the flow rate of the return flow 304), and through the valve 214 to the vacuum generator 212. A control flow 306 may flow from the regulator 208 through the valve 210 and to the vacuum generator 212. An exhaust flow 308, which may include a combination of the return flow 304 and the control flow 306, may be generated by the vacuum generator 212 and exhausted out of the gas supply system 130 through the gas outlet 204.

As indicated above, FIG. 3 is provided as an example. Other examples may differ from what is described with regard to FIG. 3.

Figure 4A:
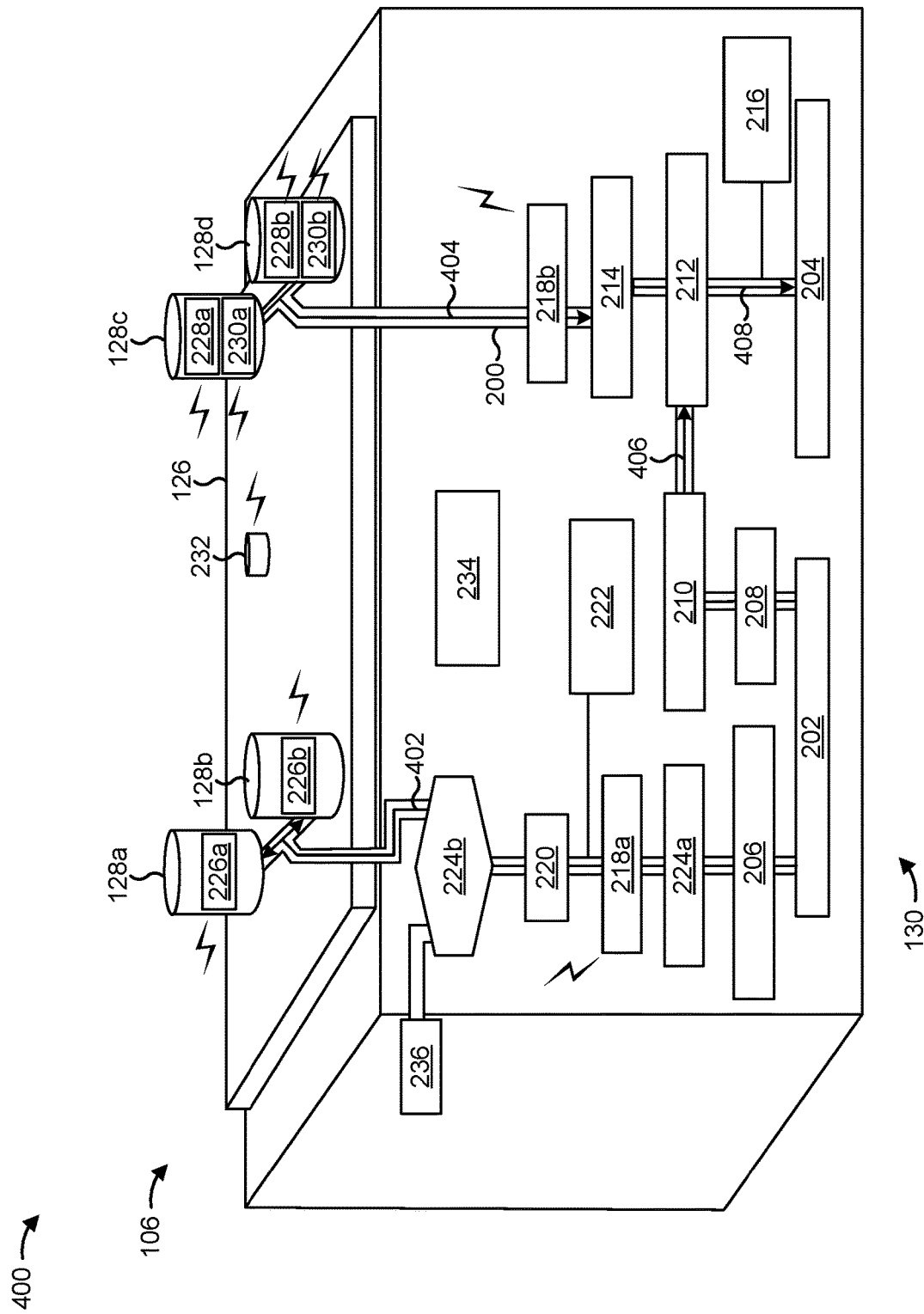
Figure 4B:
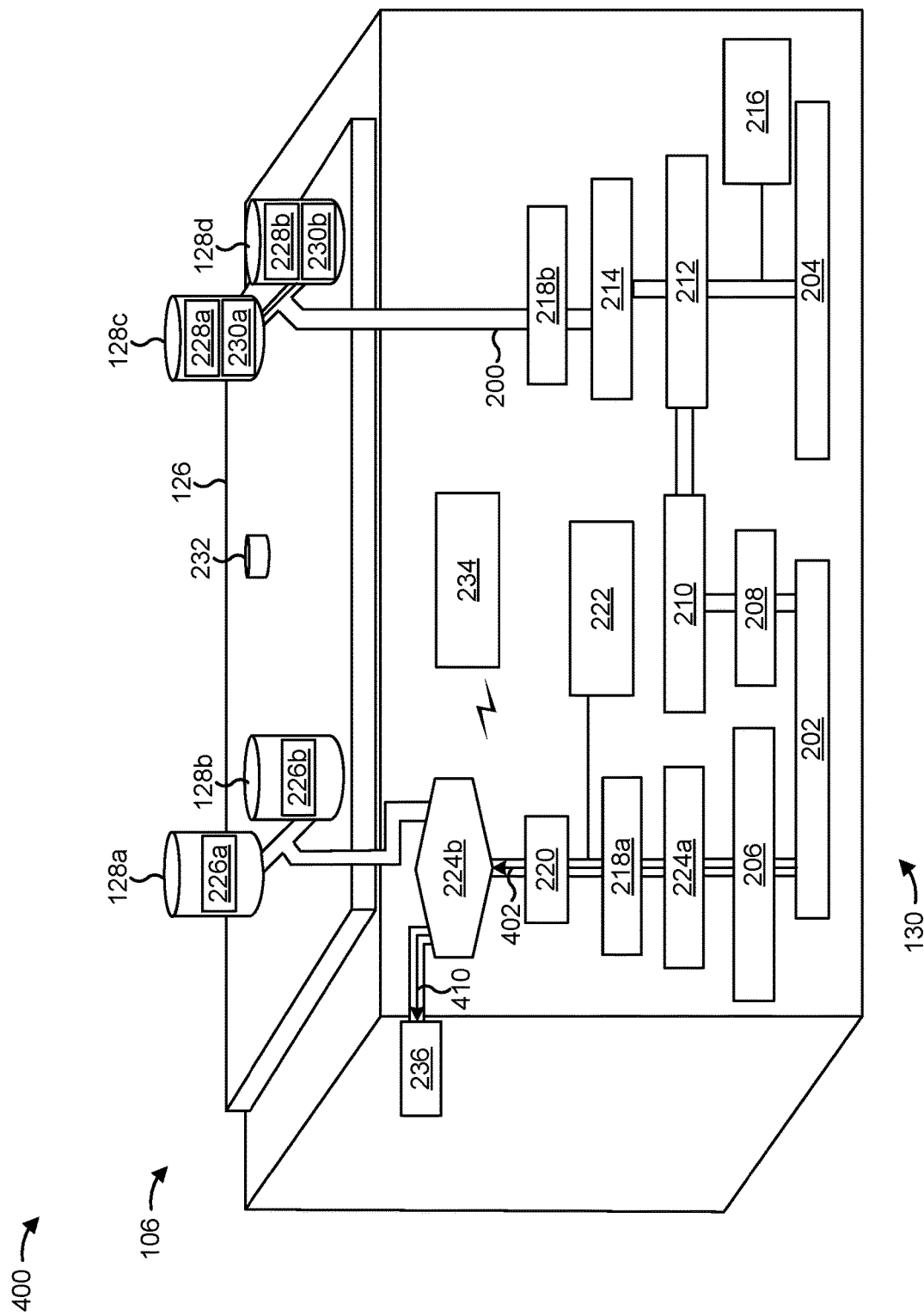

FIGS. 4A and 4B are diagrams of an example implementation 400 described herein. The example implementation 400 may include an example of determining that a blockage of a diffuser 124 of the transport carrier 108 has occurred and performing one or more actions to mitigate the blockage.

FIG. 4A illustrates an example of the gas supply system 130 in operation, in which a supply flow 402 of a gas is provided to the transport carrier 108 through the inlet ports 128a and 128b, a return flow 404 of the gas is received in the gas supply system 130 through the outlet ports 128c and 128d, and a control flow 406 of the gas and the return flow 404 are used by the vacuum generator 212 to generate an exhaust flow 408 out of the gas supply system 130 through the gas outlet 204.

The sensors included in the gas supply system 130 may generate sensor data while a gas flows through the gas supply system 130. For example, the flow rate sensor 218a may generate flow rate data based on a flow rate of the supply flow 402 of the gas. As another example, the pressure sensors 226a and 226b may generate pressure data associated with a pressure of the supply flow 402 of the gas at or near the inlet ports 128a and 128b, respectively. As another example, the pressure sensors 228a and 228b may generate pressure data associated with a pressure of the return flow 404 of the gas at or near the outlet ports 128c and 128d, respectively. As another example, the humidity sensors 230a and 230b may generate humidity data associated with a relative humidity of the return flow 404 of the gas at or near the outlet ports 128c and 128d, respectively. As another example, the flow rate sensor 218b may generate flow rate data based on a flow rate of the return flow 404 of the gas. As another example, the vibration sensor 232 may generate vibration data based on vibration of the load port stage 126. The sensors 218a, 218b, 226a, 226b, 228a, 228b, 230a, 230b, and 232 may transmit the sensor data to the controller 234.

Turning to FIG. 4B, the controller 234 may receive the sensor data from the sensors 218a, 218b, 226a, 226b, 228a, 228b, 230a, 230b, and 232. The controller 234 may determine whether a blockage of a diffuser 124 in the transport carrier 108 has occurred based on the sensor data, and may cause one or more components of the gas supply system 130 to perform various actions to mitigate the blockage. In some implementations, the controller 234 determines whether a blockage of a diffuser 124 has occurred by determining whether one or more parameters of the gas supply system 130 satisfy one or more parameter thresholds configured for the gas supply system 130.

As an example, the controller 234 may receive pressure data from the pressure sensors 226a, 226b, 228a, and/or 228b and may determine, based on the pressure data, whether a measure of pressure in the gas supply system 130 at the inlet ports 128a and 128b and/or at the outlet ports 128c and 128d does not satisfy a pressure threshold. The controller 234 may determine that a blockage of a diffuser 124 has occurred if the measure of the pressure does not satisfy the pressure threshold (e.g., if the measure of the pressure is equal to or exceeds the pressure threshold). The pressure threshold may be configured to be 5% greater, 10% greater, or another percentage greater than a pressure setting for the supply flow 402. As an example, if the pressure setting for the supply flow 402 is approximately 120 pounds per square inch (PSI), the pressure threshold may be configured as approximately 132 PSI. However, other values for the pressure threshold are within the scope of the present disclosure.

As another example, the controller 234 may receive humidity data from the humidity sensors 230a and 230b, and may determine, based on the humidity data, whether a measure of humidity (e.g., relative humidity or another humidity measurement) in the transport carrier satisfies a humidity threshold. The controller 234 may determine that a blockage of a diffuser 124 has occurred if the measure of the humidity does not satisfy the humidity threshold (e.g., if the measure of the humidity is equal to or exceeds the humidity threshold). The humidity threshold may be configured to be in a range of greater than 0% relative humidity to approximately 30% relative humidity so as to protect the semiconductor substrates stored in the transport carrier 108 from being contaminated and/or damaged. However, other values for the humidity threshold are within the scope of the present disclosure.

As another example, the controller 234 may receive vibration data from the vibration sensor 232, and may determine, based on the vibration data, whether a vibration magnitude associated with the load port stage 126 satisfies a vibration threshold. The controller 234 may determine that a blockage of a diffuser 124 has occurred if the vibration magnitude does not satisfy the vibration threshold (e.g., if the vibration magnitude is equal to or exceeds the vibration threshold), as a blockage of a diffuser 124 may cause the transport carrier 108 to vibrate, which may cause the load port stage 126 to vibrate. The vibration threshold may be configured to be in a range of approximately 0.1 g-force to approximately 0.3 g-force so as to protect the semiconductor substrates stored in the transport carrier 108 from being damaged by vibration of the transport carrier 108. However, other values for the vibration threshold are within the scope of the present disclosure.

As another example, the controller 234 may receive flow rate data from the flow rate sensor 218a and the flow rate sensor 218b. The flow rate data from the flow rate sensor 218a may be associated with the supply flow 402 of the gas, and the flow rate data from the flow rate sensor 218b may be associated with the return flow 404 of the gas. The controller 234 may determine a flow rate differential, between a flow rate of the supply flow 402 and a flow rate of the return flow 404, based on the flow rate data from the flow rate sensor 218a and the flow rate data from the flow rate sensor 218b. The controller 234 may determine whether the flow rate differential satisfies a differential threshold. The controller 234 may determine that a blockage of a diffuser 124 has occurred if the flow rate differential does not satisfy the differential threshold. A blockage of a diffuser 124 may cause a drop in flow rate of the return flow 404 of the gas. Accordingly, a blockage of a diffuser 124 may cause an increase in the pressure differential (due to a drop in flow rate of the return flow 404) such that the pressure differential is equal to or lower than the differential threshold. The differential threshold may be configured to be 5% lower, 10% lower, or another percentage lower than a flow rate differential setting for the gas supply system 130. As an example, if the flow rate differential setting is a drop of approximately 5 liters per minute (LPM), the differential threshold may be configured as approximately 4.5 LPM. However, other values for the differential threshold are within the scope of the present disclosure.

In some implementations, the controller 234 determines whether a blockage of a diffuser 124 has occurred based on a plurality of parameter thresholds and/or based on relationships between different types of measurements provided in the sensor data received from the sensors 218a, 218b, 226a, 226b, 228a, 228b, 230a, 230b, and/or 232. As described above, the regulator 206 may regulate the pressure of the supply flow 402 based on a flow rate setting for the supply flow 402. For example, the regulator 206 may regulate the pressure of the supply flow 402 within a particular pressure range to maintain the flow rate of the supply flow 402 at or near the flow rate setting. Accordingly, the controller 234 may determine that a blockage of a diffuser 124 has occurred based on determining that the regulated pressure of the supply flow 402 (e.g., as determined based on pressure data from the pressure sensors 226a and 226b) is within the pressure range for an associated flow rate setting, but the flow rate (e.g., as determined based on flow rate data from the flow rate sensor 218a) that is achieved with the regulated pressure is not within a configured tolerance (e.g., 5% or 10%, among other examples) for the flow rate setting. As an example, the controller 234 may determine that a blockage of a diffuser 124 has occurred based on determining that the pressure of the supply flow 402 is within a pressure range of 40 to 50 kilopascals (kPa) for a flow rate setting of 130 LPM, but the measured flow rate of the supply flow 402 is greater than 10% lower than the flow rate setting. In some implementations, the controller 234 may determine that a blockage of a diffuser 124 has occurred based on determining that a relationship between the flow rate of the supply flow 402 and a pressure of the supply flow 402 has become non-linear if the relationship between the flow rate and the pressure is expected to be linear.

In some implementations, the controller 234 causes the relief valve 236 to be opened such that the supply flow 402 of the gas may be redirected or diverted away from the transport carrier 108 such that a relief flow 410 of the gas is purged from the gas supply system 130 through the relief valve 236 to relieve the pressure at the inlet ports 128a and 128b and/or at the outlet ports 128c and 128d based on determining that a blockage of a diffuser 124 has occurred. The controller 234 may provide a signal (e.g., a voltage, a current), a communication, and/or another type of input to the relief valve 236 that causes the relief valve 236 to open. The controller 234 may also cause a notification to be displayed on a display of the load port 106 (and/or on a display of another tool in the semiconductor processing environment 100) indicating the blockage. In this way, the semiconductor substrates may be removed from the transport carrier 108, and the transport carrier 108 may be removed from operation and repaired or replaced. In some implementations, the controller 234 automatically causes the transport tool 114 or another transport tool to remove the semiconductor substrates from the transport carrier 108 based on determining that a blockage of a diffuser 124 has occurred.

In some implementations, the controller 234 causes the regulator 206 to adjust a flow rate of the supply flow 402 and/or a pressure of the supply flow 402 based on determining that a blockage of a diffuser 124 has occurred. The controller 234 may provide a signal (e.g., a voltage, a current), a communication, and/or another type of input to the regulator 206 to adjust a digital flow rate setting or a digital pressure setting of the regulator 206, and the regulator 206 may adjust the flow rate or the pressure of the supply flow 402 based on the adjusted digital flow rate setting or the adjusted digital pressure setting.

In some implementations, the controller 234 performs additional and/or alternative actions based on the sensor data. As an example, the controller 234 may receive the pressure data from the pressure sensors 226a and 226b, and may receive the pressure data from the pressure sensors 228a and 228b. The controller 234 may use the pressure data from the sensors 226a, 226b, 228a, and 228b to determine whether the transport carrier 108 is level on the load port stage 126. The controller 234 may determine, based on the pressure data from the sensors 226a, 226b, 228a, and 228b, whether there is a difference in pressure between two or more of the ports 128, and whether the difference in pressure satisfies a threshold difference. The threshold difference may include a 5% difference, a 10% difference, or another threshold difference that may indicate that leveling issues with the load port stage 126, the plurality of ports 128, and/or the transport carrier 108 are present. If the controller 234 determines that the difference in pressure satisfies the threshold difference, the controller 234 may determine that the transport carrier 108 is not level on the load port stage 126, and may cause a notification to be displayed on a display associated with the load port 106 (or another tool of the semiconductor processing environment 100) indicating the leveling issue. The leveling issue may include tilt or unevenness in the load port stage 126 causing the transport carrier 108 to be unlevel, may include damage to the bottom of the transport carrier 108 causing the transport carrier 108 to sit unlevel on the load port stage 126, and/or may include uneven ports 128, among other examples. In this way, the notification may be displayed such that the transport carrier 108 may be repaired, the load port stage 126 may be adjusted, and/or one or more of the ports 128 may be adjusted.

As indicated above, FIGS. 4A and 4B are provided as an example. Other examples may differ from what is described with regard to FIGS. 4A and 4B. In some implementations, the controller 234 may automatically cause the transport carrier 108 to be removed from the load port stage 126 by an OHT vehicle or another transport tool based on detecting a leveling issue with the load port stage 126, the transport carrier 108 and/or the ports 128.

Figure 5A:
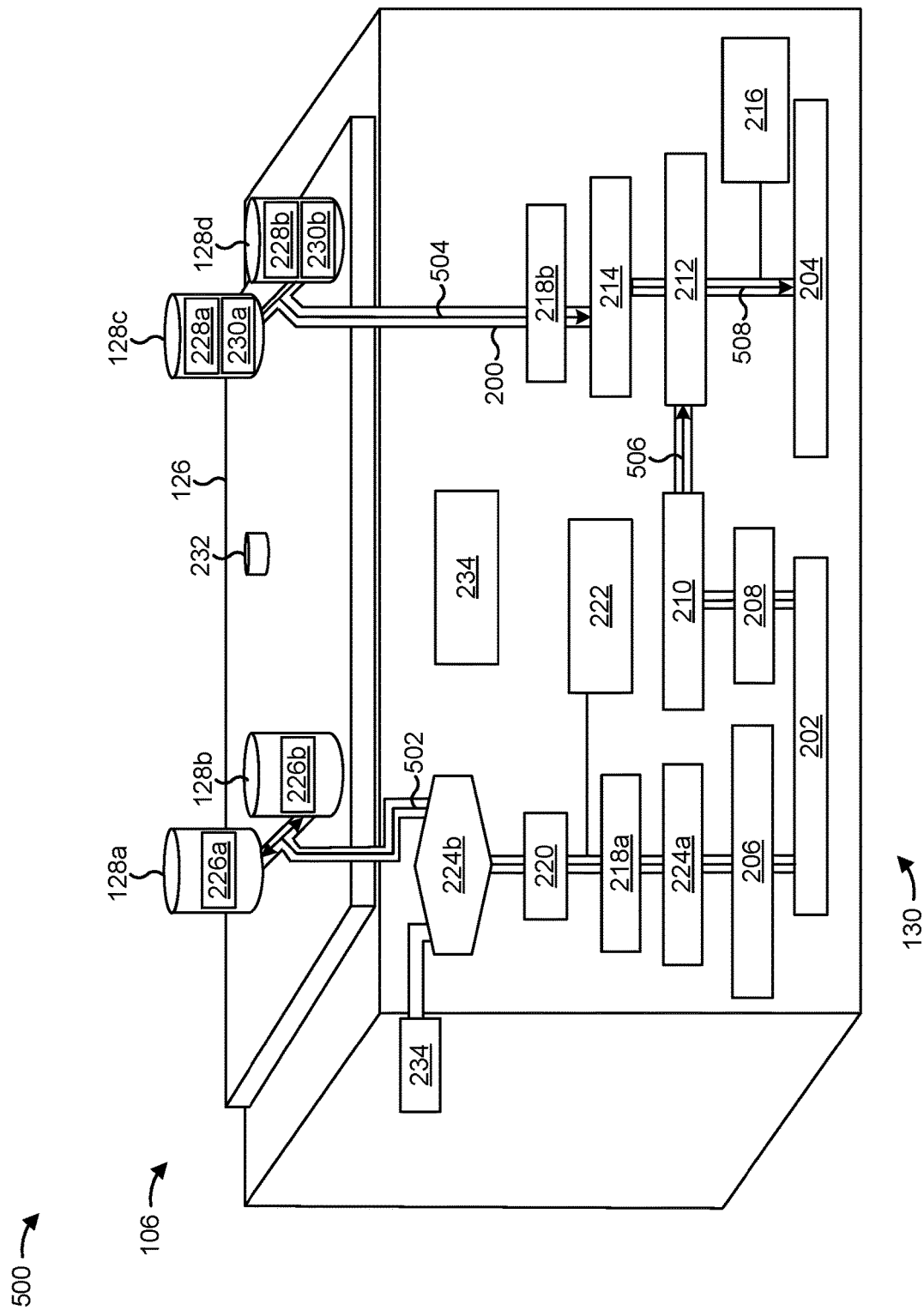
Figure 5B:
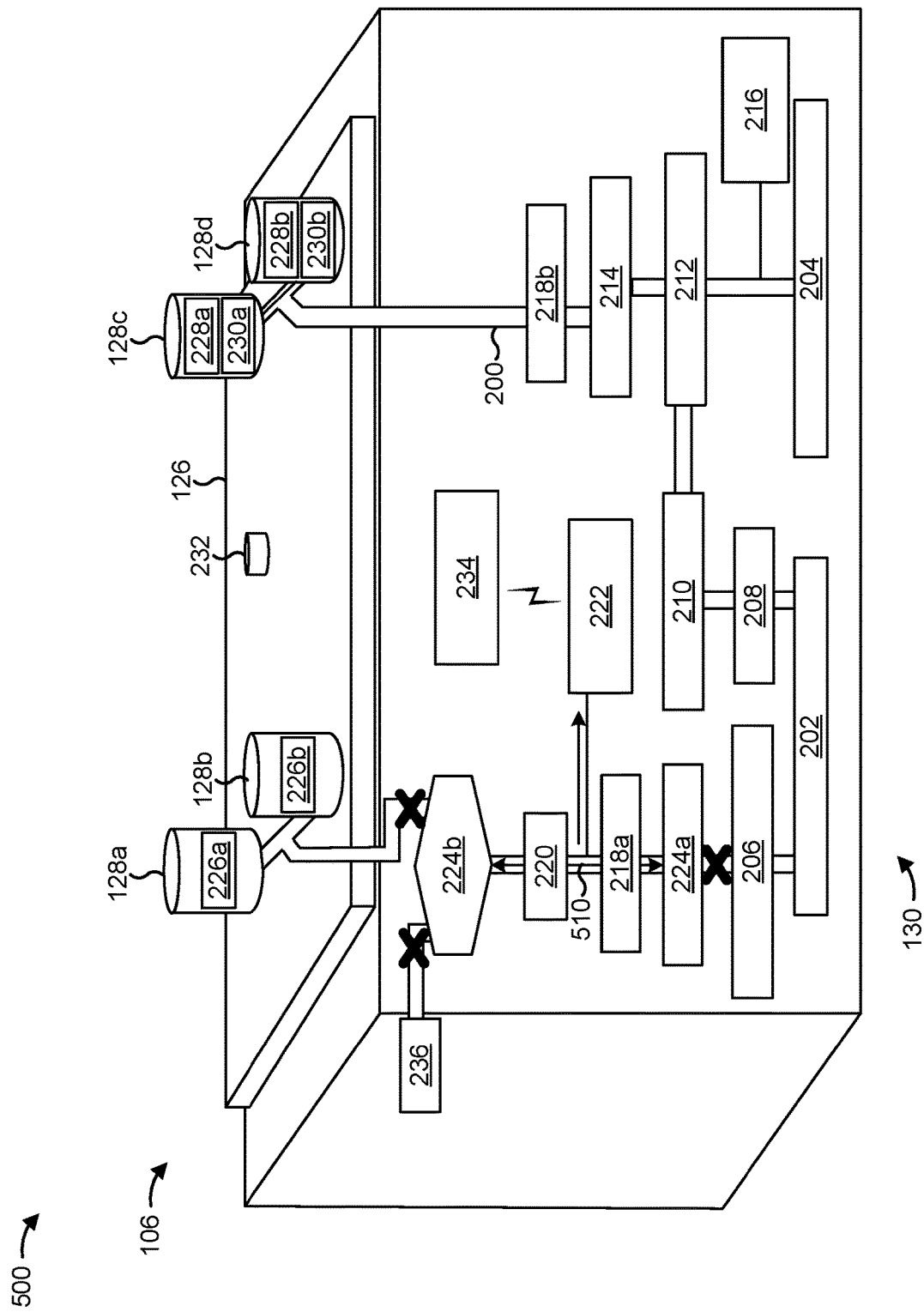

FIGS. 5A and 5B are diagrams of an example implementation 500 described herein. The example implementation 500 may include an example of determining whether a leakage of one or more components in the gas supply system 130 has occurred.

FIG. 5A illustrates an example of the gas supply system 130 in operation, in which a supply flow 502 of a gas is provided to the transport carrier 108 through the inlet ports 128a and 128b, a return flow 504 of the gas is received in the gas supply system 130 through the outlet ports 128c and 128d, and a control flow 506 of the gas and the return flow 504 are used by the vacuum generator 212 to generate an exhaust flow 508 out of the gas supply system 130 through the gas outlet 204.

As shown in FIG. 5B, the gas supply system 130 may transition to a configuration in which one or more components of the gas supply system 130 are isolated and checked for leaks. The controller 234 may cause the gas supply system 130 to transition to the configuration by causing the isolation valves 224a and 224b to close to isolate the one or more components. The controller 234 may provide a signal (e.g., a voltage, a current), a communication, and/or another type of input to cause the isolation valves 224a and 224b to close. In this way, the gas is prevented from flowing along a flow path 510 between the isolation valves 224a and 224b so that the components along the flow path 510 may be checked for leaks. The one or more components may include valves, regulators, sensors, filters, portions of the pipeline 200, and/or other types of components. The placement of the isolation valves 224a and 224b in FIG. 5B is an example, and other placements of the isolation valves 224a and 224b are within the scope of the present disclosure.

With the isolation valves 224a and 224b, the pressure sensor 222 may generate pressure data associated with the one or more components along the flow path 510. The pressure sensor 222 may provide the pressure data (e.g., a signal, a communication, a voltage, a current) to the controller 234.

The controller 234 may receive the pressure data and may determine whether a leakage has occurred in the flow path 510 between the isolation valves 224a and 224b based on the pressure data. If a leakage is determined, the controller 234 may cause a cause a notification to be displayed on a display of the load port 106 (and/or on a display of another tool in the semiconductor processing environment 100) indicating the leakage and which components are estimated to be leaking so that the components can be repaired or replaced. The controller 234 may determine, based on the pressure data, that a pressure in the flow path 510 does not satisfy a pressure threshold, and may determine that a leakage has occurred based on determining that that the pressure does not satisfy the pressure threshold. The pressure threshold may be based on a pressure setting or an estimated or expected pressure in the flow path 510. As an example, if the pressure in the flow path 510 is estimated to be approximately 30 PSI, the pressure threshold may be in a range of approximately 3% lower to approximately 5% lower than the 30 PSI estimated pressure, which may occur if a leak is present in the flow path 510. However, other values for the pressure threshold are within the scope of the present disclosure.

Components of the gas supply system 130 may be checked for leaks at various times to minimize the production impact on the load port 106. In some implementations, one or more components of the gas supply system 130 are checked for leaks according to a maintenance schedule for the load port 106. In these examples, the controller 234 may automatically cause the isolation valves 224a and 224b to close based on a maintenance schedule, or may cause the isolation valves 224a and 224b to close based on receiving an instruction, so that the one or more components can be checked for leaks. In some implementations, one or more components of the gas supply system 130 are checked for leaks during down-time or idle time of the load port 106. As an example, the controller 234 may automatically cause the isolation valves 224a and 224b to close based on determining that the load port 106 has been idle for a threshold amount of time (e.g., 5 minutes, 10 minutes, or another time duration) so that the one or more components can be checked for leaks. In some implementations, one or more components of the gas supply system 130 are checked for leaks based on an abnormal humidity measurement in the gas supply system 130, based on an abnormal pressure measurement in the gas supply system 130, based on an abnormal flow rate measurement, and/or based on one or more other measurements. As an example, the controller 234 may automatically cause the isolation valves 224a and 224b to close so that the one or more components can be checked for leaks based on determining that a humidity level in the transport carrier 108 does not satisfy a humidity threshold, based on determining that a measure of pressure in the gas supply system 130 does not satisfy a pressure threshold, and/or based on determining that a measure of a flow rate in the gas supply system 130 does not satisfy a flow rate threshold, among other examples, As indicated above, FIGS. 5A and 5B are provided as an example. Other examples may differ from what is described with regard to FIGS. 5A and 5B.

Figure 6:
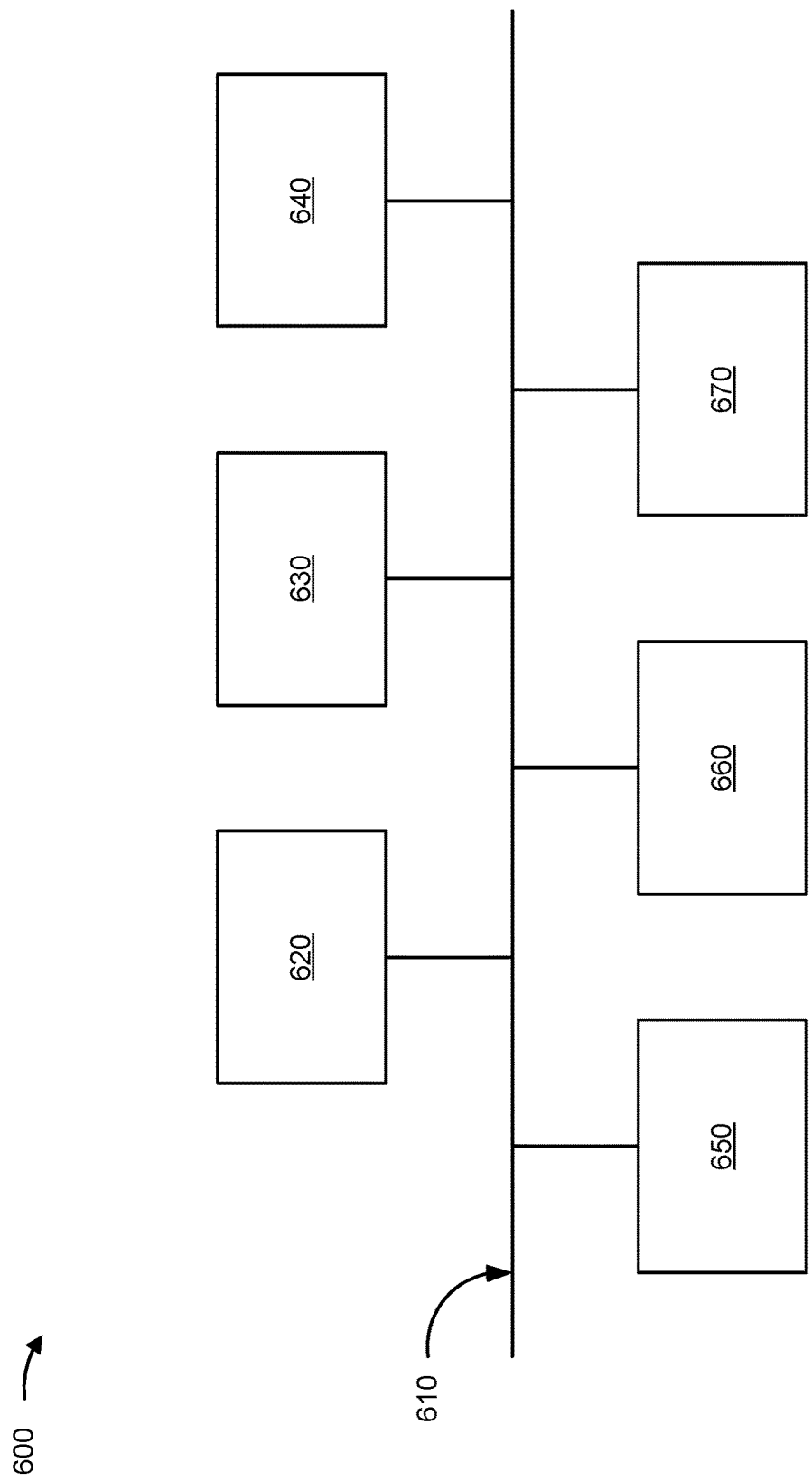
FIG. 6 is a diagram of example components of one or more devices of FIGS. 1 and/or 2.

FIG. 6 is a diagram of example components of a device 600. In some implementations, the semiconductor processing tool 102, the interface tool 104, the load port 106, the transport tool 114, the gas supply system 130, the regulator 206, the regulator 208, the valve 210, the vacuum generator 212, the valve 214, the pressure sensor 216, the flow rate sensor 218a, the flow rate sensor 218b, the pressure sensor 222, the isolation valve 224a, the isolation valve 224b, the pressure sensor 226a, the pressure sensor 226b, the pressure sensor 228a, the pressure sensor 228b, the humidity sensor 230a, the humidity sensor 230b, the vibration sensor 232, the controller 234, and/or the relief valve 236 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
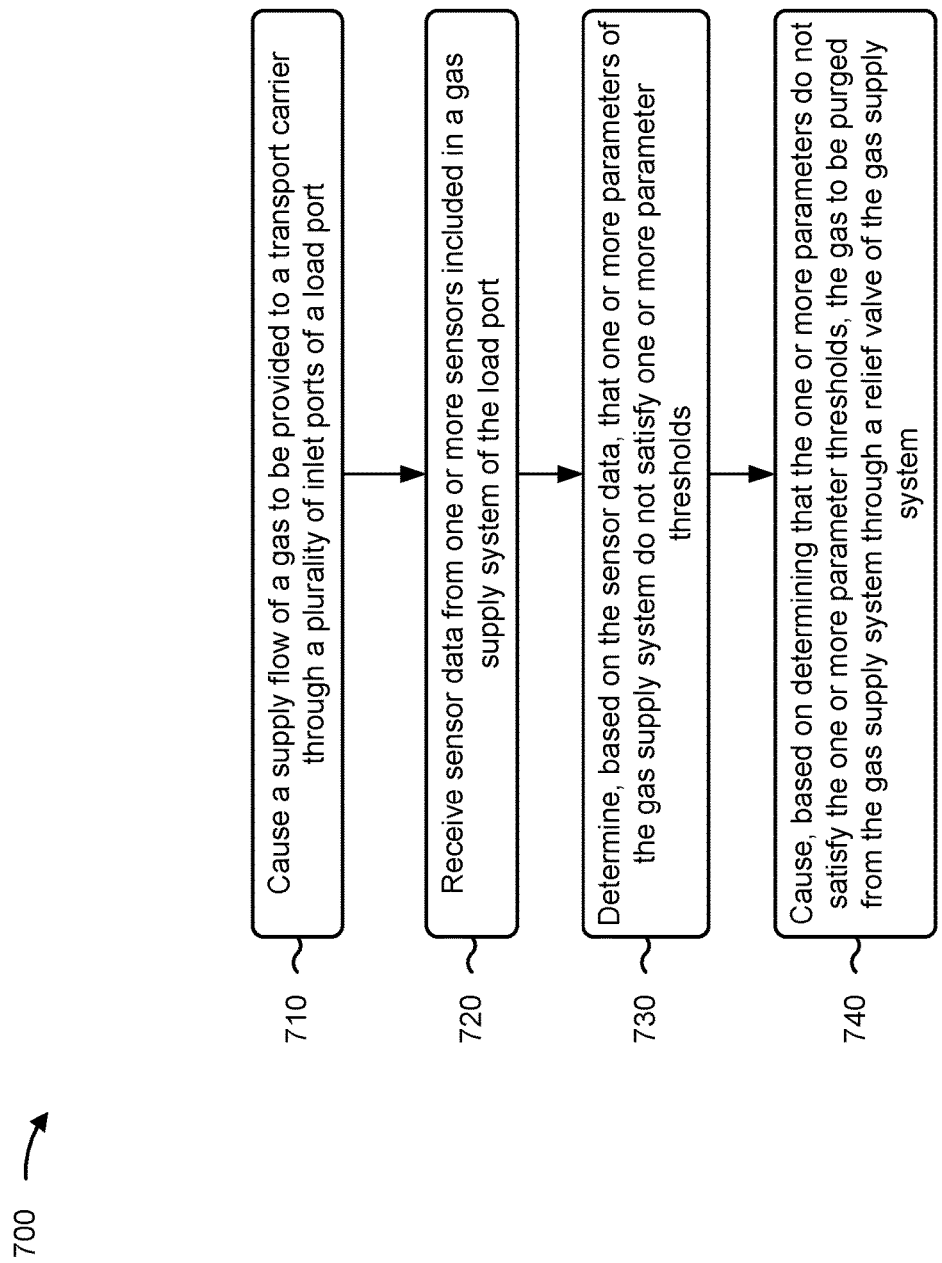
FIGS. 7 and 8 are flowcharts of example processes relating to load port operation.

FIG. 7 is a flowchart of an example process 700 associated with load port operation. In some implementations, one or more process blocks of FIG. 7 may be performed by a controller (e.g., controller 234). In some implementations, one or more process blocks of FIG. 7 may be performed by another device or a group of devices separate from or including the controller, such as the flow rate sensor 218a, the flow rate sensor 218b, the pressure sensor 226a, the pressure sensor 226b, the pressure sensor 228a, the pressure sensor 228b, the humidity sensor 230a, the humidity sensor 230b, the vibration sensor 232, and/or the relief valve 236. Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include causing a supply flow of a gas to be provided to a transport carrier through a plurality of inlet ports of the load port (block 710). For example, the controller 234 may cause a supply flow (e.g., the supply flow 302, 402, and/or 502) of a gas to be provided to the transport carrier 108 through a plurality of inlet ports (e.g., the inlet ports 128a, 128b) of the load port 106, as described above.

As further shown in FIG. 7, process 700 may include receiving sensor data from one or more sensors included in a gas supply system of the load port (block 720). For example, the controller 234 may receive sensor data from one or more sensors (e.g., the flow rate sensor 218a, the flow rate sensor 218b, the pressure sensor 226a, the pressure sensor 226b, the pressure sensor 228a, the pressure sensor 228b, the humidity sensor 230a, the humidity sensor 230b, and/or the vibration sensor 232) included in a gas supply system 130 of the load port 106, as described above.

As further shown in FIG. 7, process 700 may include determining, based on the sensor data, that one or more parameters of the gas supply system do not satisfy one or more parameter thresholds (block 730). For example, the controller 234 may determine, based on the sensor data, that one or more parameters of the gas supply system 130 do not satisfy one or more parameter thresholds, as described above.

As further shown in FIG. 7, process 700 may include causing, based on determining that the one or more parameters do not satisfy the one or more parameter thresholds, the gas to be purged from the gas supply system through a relief valve of the gas supply system (block 740). For example, the controller 234 may cause, based on determining that the one or more parameters do not satisfy the one or more parameter thresholds, the gas to be purged from the gas supply system 130 through the relief valve 236 of the gas supply system 130, as described above.

Process 700 may include additional implementations, such as any single implementation or any combination of implementations described below and/or in connection with one or more other processes described elsewhere herein.

In a first implementation, the one or more parameter thresholds are configured to indicate that a blockage of the diffuser 124 in the transport carrier 108 has occurred. In a second implementation, alone or in combination with the first implementation, receiving the sensor data from the one or more sensors includes receiving pressure data from one or more pressure sensors (e.g., the pressure sensors 226a and/or 226b) associated with the plurality of inlet ports (e.g., the inlet ports 128a, 128b), determining that the one or more parameters of the gas supply system 130 does not satisfy the one or more parameter thresholds includes determining, based on the pressure data, that a measure of pressure in the gas supply system 130 at the plurality of inlet ports (e.g., the inlet ports 128a, 128b) does not satisfy a pressure threshold, and causing the gas to be purged from the gas supply system 130 through the relief valve 236 includes causing, based on determining that the pressure does not satisfy the pressure threshold, the gas to be purged from the gas supply system 130 through the relief valve 236.

In a third implementation, alone or in combination with one or more of the first and second implementations, the pressure threshold is based on a pressure range associated with a flow rate setting of the supply flow (e.g., the supply flow 302, 402, and/or 502) of the gas. In a fourth implementation, alone or in combination with one or more of the first through third implementations, receiving the sensor data from the one or more sensors includes receiving humidity data from a humidity sensor (e.g., the humidity sensor 230a and/or 230b) associated with a plurality of outlet ports (e.g., the outlet ports 128c, 128d), of the load port 106, through which a return flow (e.g., the return flow 304, 404, and/or 504) of the gas is to flow from the transport carrier 108, determining that the one or more parameters of the gas supply system 130 does not satisfy the one or more parameter thresholds includes determining, based on the humidity data, that a measure of humidity in the transport carrier 108 does not satisfy a humidity threshold, and causing the gas to be purged from the gas supply system 130 through the relief valve 236 includes causing, based on determining that the humidity does not satisfy the humidity threshold, the gas to be purged from the gas supply system 130 through the relief valve 236.

In a fifth implementation, alone or in combination with one or more of the first through fourth implementations, the humidity threshold is in a range of approximately 0% relative humidity to approximately 30% relative humidity. In a sixth implementation, alone or in combination with one or more of the first through fifth implementations, receiving the sensor data from the one or more sensors includes receiving vibration data from the vibration sensor 232 on a load port stage 126 of the load port 106, determining that the one or more parameters of the gas supply system 130 does not satisfy the one or more parameter thresholds includes determining, based on the vibration data, that a vibration magnitude associated with the load port stage 126 does not satisfy a vibration threshold, and causing the gas to be purged from the gas supply system 130 through the relief valve 236 includes causing, based on determining that the vibration magnitude does not satisfy the vibration threshold, the gas to be purged from the gas supply system 130 through the relief valve 236.

In a seventh implementation, alone or in combination with one or more of the first through sixth implementations, the vibration threshold is in a range of approximately 0.1 g-force to approximately 0.3 g-force. In an eighth implementation, alone or in combination with one or more of the first through seventh implementations, receiving the sensor data from the one or more sensors comprises receiving, from a first flow rate sensor (e.g., the flow rate sensor 218*a*), first flow rate data associated with the supply flow (e.g., the supply flow 302, 402, and/or 502) of the gas, and receiving, from a second flow rate sensor (e.g., the flow rate sensor 218*b*), second flow rate data associated with a return flow (e.g., the return flow 304, 404, and/or 504) of the gas from the transport carrier 108 through a plurality of outlet ports (e.g., the outlet ports 128*c*, 128*d*) of the load port 106, and determining that the one or more parameters of the gas supply system 130 does not satisfy the one or more parameter thresholds includes determining a flow rate differential based on the first flow rate data and the second flow rate data, and determining that the flow rate differential does not satisfy a differential threshold, and causing the gas to be purged from the gas supply system 130 through the relief valve 236 includes causing, based on determining that the flow rate differential does not satisfy the differential threshold, the gas to be purged from the gas supply system 130 through the relief valve 236.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
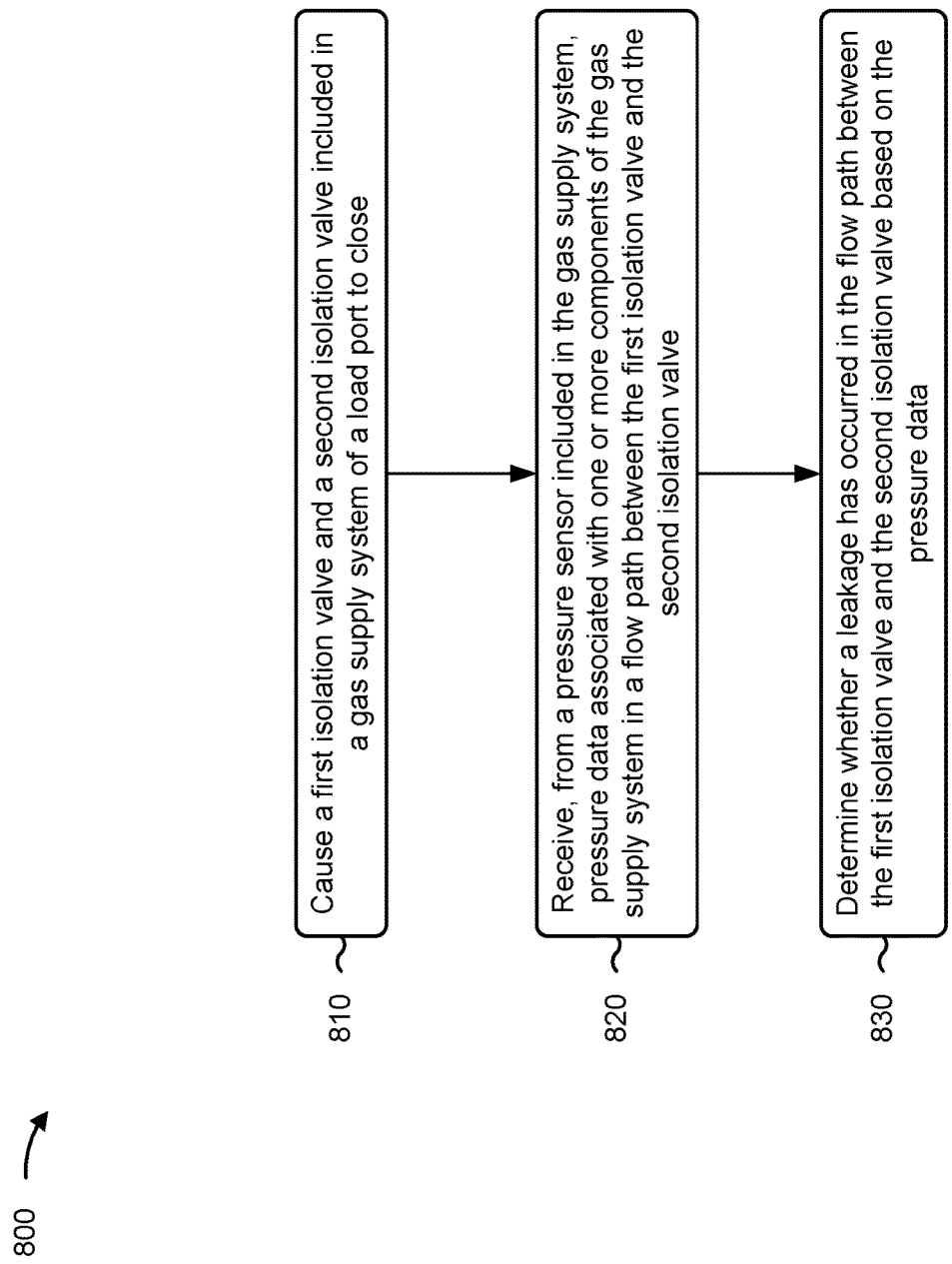

FIG. 8 is a flowchart of an example process 800 associated with load port operation. In some implementations, one or more process blocks of FIG. 7 may be performed by a controller (e.g., controller 234). In some implementations, one or more process blocks of FIG. 7 may be performed by another device or a group of devices separate from or including the controller, such as the flow rate sensor 218*a*, the flow rate sensor 218*b*, the pressure sensor 226*a*, the pressure sensor 226*b*, the pressure sensor 228*a*, the pressure sensor 228*b*, the humidity sensor 230*a*, the humidity sensor 230*b*, the vibration sensor 232, and/or the relief valve 236. Additionally, or alternatively, one or more process blocks of FIG. 7 may be performed by one or more components of device 600, such as processor 620, memory 630, storage component 640, input component 650, output component 660, and/or communication component 670.

As shown in FIG. 8, process 800 may include causing a first isolation valve and a second isolation valve included in a gas supply system of the load port to close (block 810). For example, the controller may cause a first isolation valve 224*a* and a second isolation valve 224*b* included in a gas supply system 130 of the load port to close, as described above. In some implementations, the first isolation valve and the second isolation valve are closed to prevent a supply flow 502 of a gas from flowing between the first isolation valve and the second isolation valve.

As further shown in FIG. 8, process 800 may include receiving, from a pressure sensor included in the gas supply system, pressure data associated with one or more components of the gas supply system in a flow path between the first isolation valve and the second isolation valve (block 820). For example, the controller may receive, from a pressure sensor 222 included in the gas supply system, pressure data associated with one or more components of the gas supply system in a flow path 510 between the first isolation valve and the second isolation valve, as described above. In some implementations, the pressure data was generated while the first isolation valve and the second isolation valve are closed.

As further shown in FIG. 8, process 800 may include determining whether a leakage has occurred in the flow path between the first isolation valve and the second isolation valve based on the pressure data (block 830). For example, the controller may determine whether a leakage has occurred in the flow path between the first isolation valve and the second isolation valve based on the pressure data, as described above.

Process 800 may include additional implementations, such as any single implementation or any combination of implementations described below and/or in connection with one or more other processes described elsewhere herein.

In a first implementation, determining whether a leakage has occurred includes determining, based on the pressure data, that a pressure in the flow path 510 between the first isolation valve 224*a* and the second isolation valve 224*b* does not satisfy a pressure threshold, and determining that a leakage has occurred based on determining that that the pressure does not satisfy the pressure threshold. In a second implementation, alone or in combination with the first implementation, the pressure threshold is in a range of approximately 3% to approximately 5% of a difference in pressure from a pressure setting for the gas supply system. In a third implementation, alone or in combination with one or more of the first and second implementations, causing the first isolation valve 224*a* and the second isolation valve 224*b* to close includes causing the first isolation valve 224*a* and the second isolation valve 224*b* to close based on receiving an instruction to perform a leakage test of the gas supply system 130.

In a fourth implementation, alone or in combination with one or more of the first through third implementations, causing the first isolation valve 224*a* and the second isolation valve 224*b* to close includes causing the first isolation valve 224a and the second isolation valve 224b to close based on determining that the load port 106 has been idle for a threshold amount of time. In a fifth implementation, alone or in combination with one or more of the first through fourth implementations, causing the first isolation valve 224a and the second isolation valve 224b to close includes causing the first isolation valve 224a and the second isolation valve 224b to close based on determining at least one of a humidity level in the transport carrier 108 on the load port 106 does not satisfy a humidity threshold, or a measure of pressure in the gas supply system 130 does not satisfy a pressure threshold.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a load port is capable of monitoring various environmental parameters associated with a transport carrier to minimize and/or prevent exposure of the semiconductor substrates therein to increased humidity, increased oxygen, increased vibration, and/or one or more other elevated environmental conditions that might otherwise contaminate the semiconductor substrates, damage the semiconductor substrates, and/or cause processing defects. For example, the load port may monitor the environmental parameters as indicators of a potential blockage of a diffuser of the transport carrier, and a relief valve may be used to divert a gas away from the transport carrier based on a determination that a diffuser blockage has occurred. In this way, the gas may be diverted through the relief valve and away from the transport carrier to prevent increased humidity, contaminants, and/or vibration from contaminating and/or damaging the semiconductor substrates. The load port may also include one or more isolation valves that are capable of isolating various components of the load port in the flow path of the gas to monitor the components for leaks. In this way, leaking components may be repaired, replaced, and/or compensated for to maintain the effectiveness of the environmental control in the transport carrier.

As described in greater detail above, some implementations described herein provide a method. The method includes causing, by a controller of a load port, a supply flow of a gas to be provided to a transport carrier through a plurality of inlet ports of the load port. The method includes receiving, by the controller, sensor data from one or more sensors included in a gas supply system of the load port. The method includes determining, by the controller and based on the sensor data, that one or more parameters of the gas supply system do not satisfy one or more parameter thresholds. The method includes causing, by the controller based on determining that the one or more parameters do not satisfy the one or more parameter thresholds, the gas to be purged from the gas supply system through a relief valve of the gas supply system.

As described in greater detail above, some implementations described herein provide a method. The method includes causing, by a controller of a load port, a first isolation valve and a second isolation valve included in a gas supply system of the load port to close, where the first isolation valve and the second isolation valve are closed to prevent a supply flow of a gas from flowing between the first isolation valve and the second isolation valve. The method includes receiving, by the controller and from a pressure sensor included in the gas supply system, pressure data associated with one or more components of the gas supply system in a flow path between the first isolation valve and the second isolation valve, where the pressure data was generated while the first isolation valve and the second isolation valve are closed. The method includes determining, by the controller, whether a leakage has occurred in the flow path between the first isolation valve and the second isolation valve based on the pressure data.

As described in greater detail above, some implementations described herein provide a load port. The load port includes a load port stage. The load port includes a plurality of inlet ports, on the load port stage, configured to provide a supply flow of a gas to a diffuser of a transport carrier. The load port includes a plurality of outlet ports, on the load port stage, configured to receive a return flow of the gas from the transport carrier. The load port includes a gas supply system, configured to provide the supply flow of the gas to the plurality of inlet ports and to receive the return flow of the gas from the plurality of outlet ports, including a plurality of pressure sensors on the plurality of inlet ports, a plurality of humidity sensors on the plurality of outlet ports, a vibration sensor on the load port stage, and a controller configured to receive sensor data from the plurality of pressure sensors, the plurality of humidity sensors, and the vibration sensor determine whether a blockage of the diffuser has occurred based on the sensor data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
causing, by a controller of a load port, a supply flow of a gas to be provided to a diffuser of a transport carrier through a plurality of inlet ports of the load port;
receiving, by the controller, sensor data from one or more sensors included in a gas supply system of the load port,
wherein the one or more sensors include at least one of:
a first pressure sensor associated with the plurality of inlet ports,
a second pressure sensor associated with a return flow of the gas associated with a plurality of outlet ports of the load port,
a first humidity sensor associated with the supply flow of the gas,
a second humidity sensor associated with the return flow of the gas,
a vibration sensor on a load port stage of the load port,
a first flow rate sensor associated with the supply flow of the gas, or
a second flow rate sensor associated with the return flow of the gas;
determining, by the controller and based on the sensor data, that one or more parameters of the gas supply system do not satisfy one or more parameter thresholds, wherein the one or more parameter thresholds are associated with a blockage of the diffuser of the transport carrier; and causing, by the controller and based on determining that the one or more parameters do not satisfy the one or more parameter thresholds, the gas to be purged from the gas supply system through a relief valve of the gas supply system.

2. The method of claim 1, wherein receiving the sensor data from the one or more sensors comprises:

receiving pressure data, from the first pressure sensor, associated with the plurality of inlet ports;

wherein determining that the one or more parameters of the gas supply system does not satisfy the one or more parameter thresholds comprises:

determining, based on the pressure data, that a measure of pressure in the gas supply system at the plurality of inlet ports does not satisfy a pressure threshold; and wherein causing the gas to be purged from the gas supply system through the relief valve comprises:

causing, based on determining that the pressure does not satisfy the pressure threshold, the gas to be purged from the gas supply system through the relief valve.

3. The method of claim 2, wherein the pressure threshold is based on a pressure range associated with a flow rate setting of the supply flow of the gas.

4. The method of claim 1, wherein receiving the sensor data from the one or more sensors comprises:

receiving humidity data from, the second humidity sensor, associated with the return flow of the gas;

wherein determining that the one or more parameters of the gas supply system does not satisfy the one or more parameter thresholds comprises:

determining, based on the humidity data, that a measure of humidity in the transport carrier does not satisfy a humidity threshold; and wherein causing the gas to be purged from the gas supply system through the relief valve comprises:

causing, based on determining that the humidity does not satisfy the humidity threshold, the gas to be purged from the gas supply system through the relief valve.

5. The method of claim 4, wherein the humidity threshold is in a range of approximately 0% relative humidity to approximately 30% relative humidity.

6. The method of claim 1, wherein receiving the sensor data from the one or more sensors comprises:

receiving vibration data, from the vibration sensor, associated with the load port stage;

wherein determining that the one or more parameters of the gas supply system does not satisfy the one or more parameter thresholds comprises:

determining, based on the vibration data, that a vibration magnitude associated with the load port stage does not satisfy a vibration threshold; and wherein causing the gas to be purged from the gas supply system through the relief valve comprises:

causing, based on determining that the vibration magnitude does not satisfy the vibration threshold, the gas to be purged from the gas supply system through the relief valve.

7. The method of claim 6, wherein the vibration threshold is in a range of approximately 0.1 g-force to approximately 0.3 g-force.

8. The method of claim 1, wherein receiving the sensor data from the one or more sensors comprises:

receiving, from the first flow rate sensor, first flow rate data associated with the supply flow of the gas; and receiving, from the second flow rate sensor, second flow rate data associated with the return flow of the gas;

wherein determining that the one or more parameters of the gas supply system does not satisfy the one or more parameter thresholds comprises:

determining a flow rate differential based on the first flow rate data and the second flow rate data; and determining that the flow rate differential does not satisfy a differential threshold; and wherein causing the gas to be purged from the gas supply system through the relief valve comprises:

causing, based on determining that the flow rate differential does not satisfy the differential threshold, the gas to be purged from the gas supply system through the relief valve.

9. A method, comprising:

receiving, by a controller of a load port and when a supply flow of a gas is provided to a diffuser of a transport carrier, sensor data from a plurality of sensors including a first pressure sensor, on an inlet port of the load port, and a second pressure sensor on an outlet port of the load port;

determining, by the controller, whether the transport carrier is level on a load port stage of the load port, based on;

the sensor data from the first pressure sensor and the second pressure sensor, and whether a blockage of the diffuser has occurred based on the sensor data from at least one of the first pressure sensor or the second sensor pressure and further based on one or more one or more parameter thresholds; and causing, by the controller, at least one of:

a notification to be displayed when at least one of the transport carrier is not level on the load port stage or the blockage of the diffuser has occurred, an adjustment of at least one of: a flow rate of the supply flow of the gas, or a pressure of the supply flow of the gas, when the blockage of the diffuser has occurred, or a relief valve to open to purge the gas from the transport carrier when the blockage of the diffuser has occurred.

10. The method of claim 9, further comprising:

causing, when the blockage of the diffuser has occurred, an adjustment of the at least one of: the flow rate of the supply flow of the gas, or the pressure of the supply flow of the gas.

11. The method of claim 9, further comprising:

causing, based on when the blockage of the diffuser has occurred, the relief valve to open.

12. The method of claim 9, wherein the plurality of sensors further include humidity sensor associated with a return flow of the gas flowing from the transport carrier.

13. The method of claim 9, wherein the plurality of sensors further include a vibration sensor associated with a load port stage of the load port.

14. The method of claim 13, wherein the load port stage is between the inlet port and a gas supply system of the load port.

15. A method, comprising:
causing, by a controller of a load port, a supply flow of a gas to be provided to a diffuser of a transport carrier through an inlet port of the load port;
receiving, by the controller, sensor data from one or more sensors included in a gas supply system of the load port, wherein the inlet port resides on a first side of a load port stage of the load port and the gas supply system resides on a second side of the load port stage, wherein the first side of the load port stage is opposite from the second side of the load port stage, and wherein the load port stage is between the inlet port and the gas supply system, wherein the one or more sensors comprises at least one of: a first flow rate sensor, associated with the supply flow of the gas or a vibration sensor on the load port stage;
determining, by the controller and based on the sensor data, that there is a blockage of the diffuser based on one or more parameter thresholds; and
causing, by the controller and based on determining that there is the blockage of the diffuser, the gas to be purged from the gas supply system through a relief valve of the gas supply system.

16. The method of claim 15, wherein determining that there is the blockage of the diffuser is based on one or more parameters of the gas supply system not satisfying the one or more parameter thresholds.

17. The method of claim 15, wherein the one or more sensors include the vibration sensor on the load port stage.

18. The method of claim 15, wherein the one or more sensors include a humidity sensor associated with the supply flow of the gas.

19. The method of claim 15, wherein the one or more sensors include a humidity sensor associated with a return supply flow of the gas associated with an outlet port.

20. The method of claim 15, wherein the one or more sensors include at least one of the first flow rate sensor, associated with the supply flow of the gas, or a second flow rate sensor associated with a return flow of the gas associated with an outlet port.

* * * * *